(12) United States Patent
Kim

(10) Patent No.: US 8,925,480 B2
(45) Date of Patent: Jan. 6, 2015

(54) MASK STICK AND METHOD OF ASSEMBLING A MASK FRAME ASSEMBLY BY USING THE MASK STICK

(75) Inventor: Yong-Hwan Kim, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 255 days.

(21) Appl. No.: 13/303,617

(22) Filed: Nov. 23, 2011

(65) Prior Publication Data

US 2012/0282445 A1    Nov. 8, 2012

(30) Foreign Application Priority Data

May 2, 2011   (KR) .................. 10-2011-0041542

(51) Int. Cl.
| | |
|---|---|
| *B05C 11/00* | (2006.01) |
| *C23C 14/04* | (2006.01) |
| *H01L 51/56* | (2006.01) |
| *B05C 21/00* | (2006.01) |
| *C23C 14/12* | (2006.01) |
| *H01L 51/00* | (2006.01) |
| *B05B 15/04* | (2006.01) |

(52) U.S. Cl.
CPC ............. *C23C 14/042* (2013.01); *B05C 21/005* (2013.01); *H01L 51/0011* (2013.01); *B05B 15/045* (2013.01); *C23C 14/12* (2013.01)
USPC ........... 118/504; 118/505; 118/720; 118/721; 427/282

(58) Field of Classification Search
CPC .. C23C 14/042; C23C 16/042; H01L 51/011; B05C 21/005
USPC .................................. 118/504, 505, 720, 721
See application file for complete search history.

(56) References Cited

U.S. PATENT DOCUMENTS

| | | | |
|---|---|---|---|
| 6,501,214 B1* | 12/2002 | Sakamoto et al. ............ 313/407 |
| 2001/0018309 A1* | 8/2001 | Nishiki et al. .................. 445/30 |
| 2007/0190889 A1* | 8/2007 | Lee et al. ......................... 445/47 |
| 2009/0127236 A1 | 5/2009 | Hong et al. |
| 2009/0297768 A1* | 12/2009 | Ko ................................ 428/136 |
| 2012/0164771 A1* | 6/2012 | Lee et al. ................. 257/E33.06 |
| 2012/0174863 A1* | 7/2012 | Park .............................. 118/504 |

FOREIGN PATENT DOCUMENTS

| | | |
|---|---|---|
| JP | 09-092143 | 4/1997 |
| JP | 2000-164154 | 6/2000 |
| KR | 10-1999-0020138 A | 3/1999 |
| KR | 10-2009-0052203 | 5/2009 |
| KR | 10-2009-0123590 | 12/2009 |

* cited by examiner

*Primary Examiner* — Dah-Wei D Yuan
*Assistant Examiner* — Binu Thomas
(74) *Attorney, Agent, or Firm* — Lee & Morse, P.C.

(57) ABSTRACT

A mask stick including a main body part having a pattern formed therein, one or more side clamping parts extending from a side of the main body part, and a slant clamping part disposed adjacent an outermost one of the one or more side clamping parts, wherein an angle (θ) between the slant clamping part and the outermost side clamping parts is greater than 0° and less than 90° (0°<θ<90°).

35 Claims, 8 Drawing Sheets

MASK STICK AND METHOD OF ASSEMBLING A MASK FRAME ASSEMBLY BY USING THE MASK STICK

CROSS-REFERENCE TO RELATED PATENT APPLICATION

This application claims the benefit of Korean Patent Application No. 10-2011-0041542, filed on May 2, 2011, in the Korean Intellectual Property Office, the disclosure of which is incorporated herein in its entirety by reference.

BACKGROUND

1. Field

An aspect of embodiments relates to a mask stick and a method of assembling a mask frame assembly using the mask stick.

2. Description of the Related Art

In general, from among various display devices, organic light-emitting display devices are advantageous due to their wide viewing angle, high contrast, and fast response speed.

The organic light-emitting display devices realize light of different colors by recombination of holes and electrons respectively inserted into an anode electrode and a cathode electrode in an emission layer (EML). However, it is difficult to obtain a highly efficient emission via the aforementioned structure, and thus, intermediate layers including an electron injection layer (EIL), an electron transport layer (ETL), a hole transport layer (HTL), a hole injection layer (HIL), and the like are selectively inserted between each of the electrodes and the EML.

The electrodes and the intermediate layers including the EML of the organic light-emitting display device may be formed by using various methods, such as a depositing method. In order to manufacture organic light-emitting displays device by using the depositing method, a fine metal mask (FMM) having the same pattern as a pattern of a thin film to be formed on a substrate is aligned, and then a raw material of the thin film is deposited to form the thin film having a desired pattern.

When the size of the FMM is increased, an error of an etching operation performed to form the pattern also increases, and depression of a central portion due to a dead load occurs. Thus, recently, a mask having a pattern of several sticks has been adhered to a frame. This mask is referred to as a mask stick.

SUMMARY

According to an aspect of embodiments, there is provided a mask stick including a main body part having a pattern formed therein, one or more side clamping parts extending from a side of the main body part, and a slant clamping part disposed adjacent an outermost one of the one or more side clamping parts, wherein an angle (θ) between the slant clamping part and the outermost side clamping part is greater than 0° and less than 90° (0°<θ<90°).

The one or more side clamping parts may extend horizontally from the main body part. The one or more side clamping parts may include one or more first side clamping parts extending from a first end of the main body part, and one or more second side clamping parts extending from a second end of the main body part, the second end opposing the first end. The number of the one or more first side clamping parts may be equal to the number of the one or more second side clamping parts.

The one or more first side clamping parts may be spaced equally from each other. The one or more second side clamping parts may be spaced equally from each other. The spaces between the one or more first side clamping parts may be equal to the spaces between the one or more second side clamping parts.

The one or more first side clamping parts and the one or more second side clamping parts may be at corresponding positions at the opposing ends of the mask stick. The number of the one or more first side clamping parts may be equal to the number of the one or more second side clamping parts.

Lengths of the one or more side clamping parts may be the same. Widths of the one or more side clamping parts may be the same.

The slant clamping part may extend from a corner region of the main body part. The slant clamping part may include a plurality of slant clamping parts that extend from four corner regions of the main body part. Angles between each of the plurality of slant clamping parts and each of the one or more side clamping parts that are adjacent to the plurality of slant clamping parts may be the same.

Lengths of the plurality of slant clamping parts may be equal to each other. Widths of the plurality of slant clamping parts may be equal to each other.

A region between the main body part and the one or more side clamping parts, and a region between the main body part and the slant clamping part may be welded to a frame of a mask frame assembly. The one or more side clamping parts and the slant clamping part may be detachable from the mask stick.

According to another aspect of the present invention, there is provided a method of assembling a mask frame assembly, the method may include positioning one or more mask sticks on a frame, each of the one or more mask sticks including a main body part having a pattern formed therein, one or more side clamping parts extending from a side of the main body part, and a slant clamping part, the slant clamping part disposed adjacent an outermost one of the one or more side clamping parts, and welding the main body part to the frame by holding in position the one or more side clamping parts and the slant clamping part of each of the one or more mask sticks and applying a tension force to the main body part.

The method may further include detaching the one or more side clamping parts and the slant clamping part from the one or more mask sticks after welding is completed. A bonding part may be welded to the frame, the bonding part being above the main body part and below the one or more side clamping parts.

An angle (θ) between the slant clamping part and the outermost side clamping parts may be 0°<θ<90°. The one or more side clamping parts may extend horizontally from ends of the main body part. The one or more side clamping parts may include one or more first side clamping parts extending from a first end of the main body part; and one or more second side clamping parts extending from a second end of the main body part, the second end opposing the first end.

The number of the one or more first side clamping parts may be equal to the number of the one or more second side clamping parts. The one or more first side clamping parts may be spaced equally from each other. The one or more second side clamping parts may be spaced equally from each other. Spaces between the one or more first side clamping parts may be equal to spaces between the one or more second side clamping parts.

The one or more first side clamping parts and the one or more second side clamping parts may be formed at corresponding positions at the opposing first and second ends of the mask stick. The number of the one or more first side clamping parts may be equal to the number of the one or more second side clamping parts.

Lengths of the one or more side clamping parts may be the same. Widths of the one or more side clamping parts may be the same.

The slant clamping part may extend from a corner region of the main body part. The slant clamping part may include a plurality of slant clamping parts that extend from four corner regions of the main body part. Angles between each of the plurality of slant clamping parts and each of the one or more side clamping parts that are adjacent to the plurality of slant clamping parts may be the same.

Lengths of the plurality of slant clamping parts may be equal to each other. Widths of the plurality of slant clamping parts may be equal to each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Embodiments will be described in detail by explaining exemplary embodiments of the invention with reference to the attached drawings.

Figure 1:
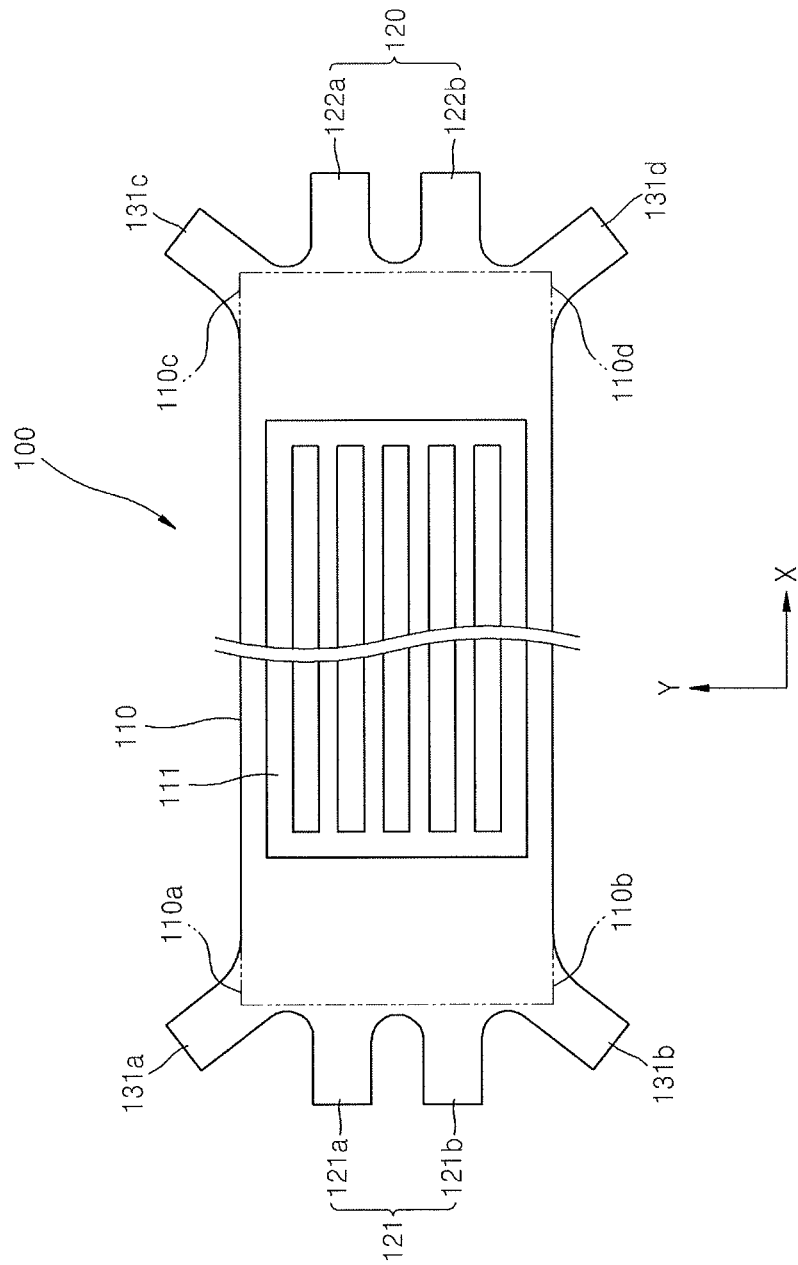
FIGS. 1 and 2 illustrate plane views of a mask stick according to an embodiment.
Figure 2:
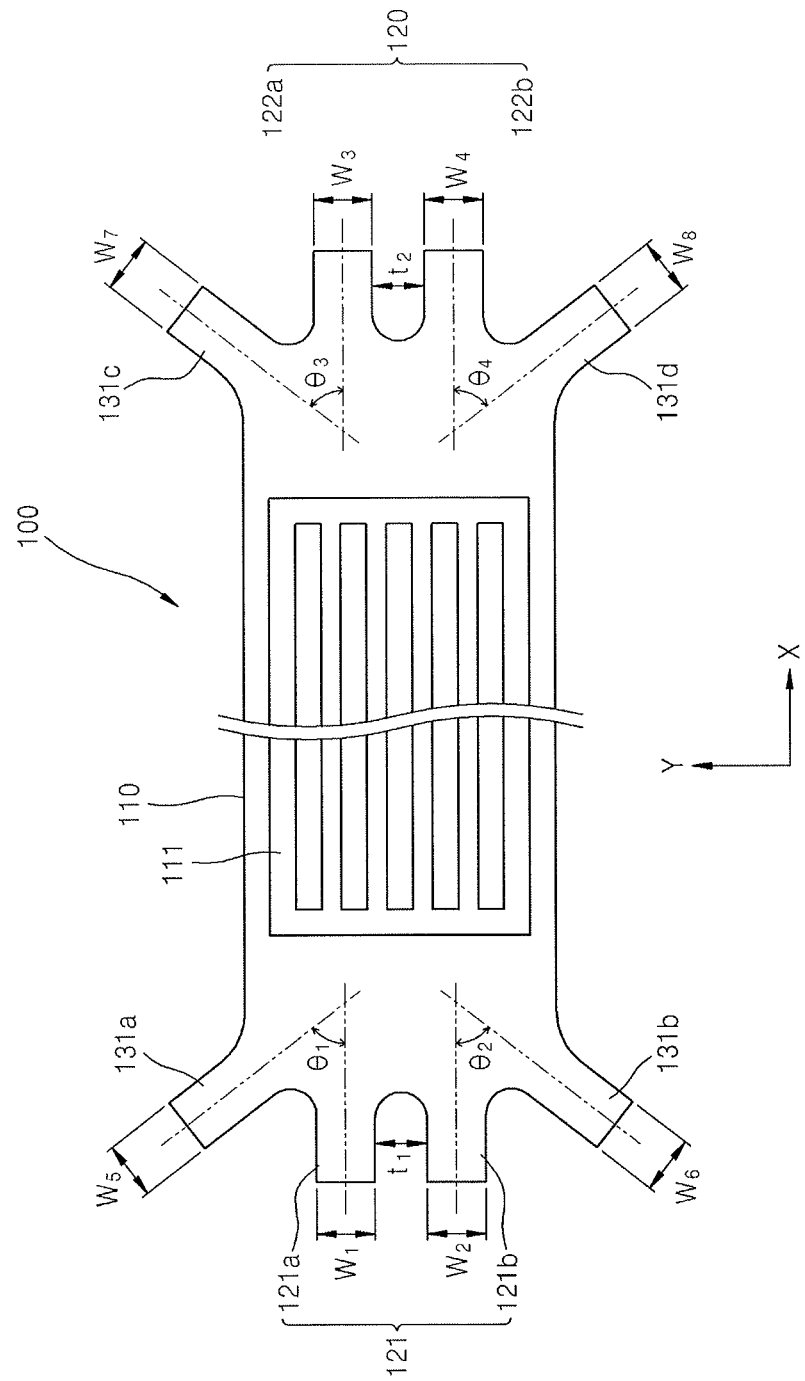
Figure 4:
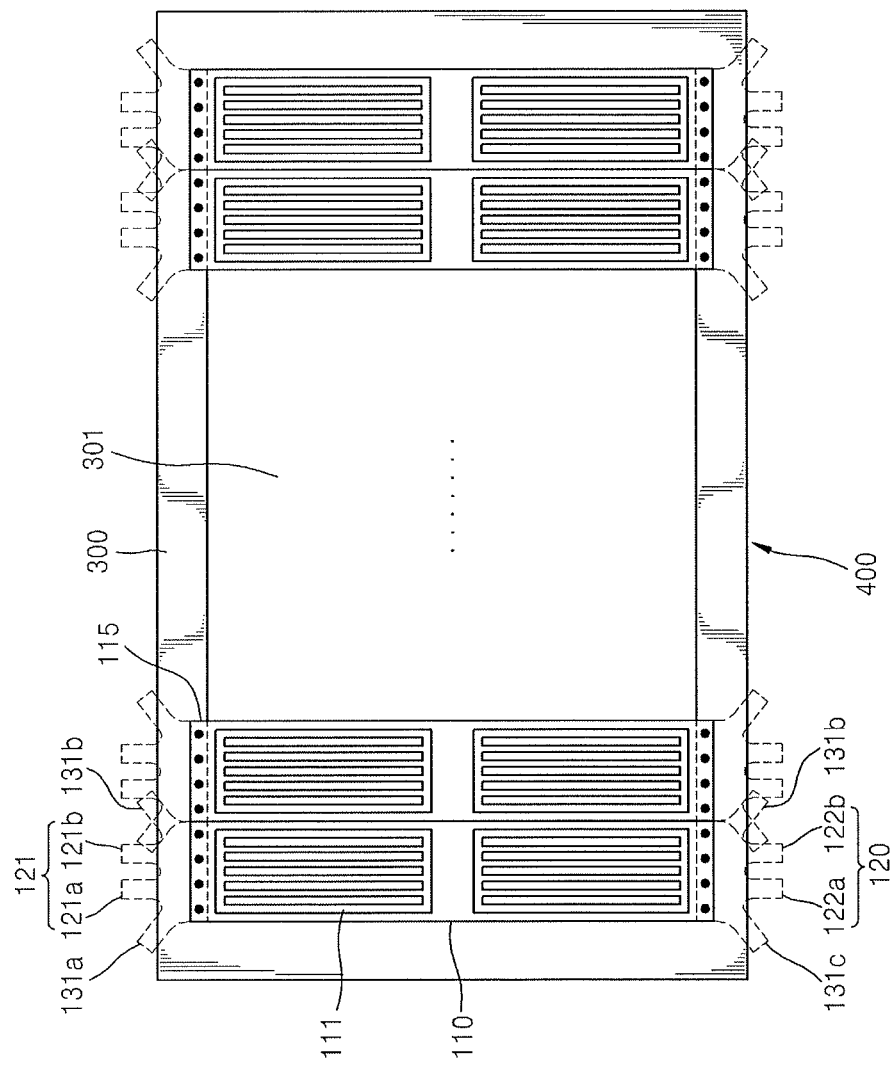
FIG. 4 illustrates a plane view of a mask frame assembly formed by combining the mask stick of FIG. 1 and a frame.

FIGS. 1 and 2 are plane views of a mask stick 100 according to an embodiment. FIG. 4 is a plane view of a mask frame assembly 400 formed by combining the mask stick 100 of FIG. 1 and a frame 300.

Referring to FIGS. 1 and 2, a plurality of the mask sticks 100 may be welded to the frame 300 (refer to FIG. 4), thereby forming the mask frame assembly 400 (refer to FIG. 4). The mask stick 100 may be formed of nickel, a nickel alloy, a nickel-cobalt alloy, or the like.

The mask stick 100 may include a main body part 110, a pair of side clamping parts 120 and 121, and slant clamping parts 131a, 131b, 131c, and 131d.

The main body part 110 may have a pattern 111 formed therein. A deposition material may be deposited on a deposition-target object via the pattern 111. The main body part 110 may be welded to the frame 300, thereby forming the mask frame assembly 400 that is used in a deposition operation. The side clamping parts 120 and 121, and the slant clamping parts 131a, 131b, 131c, and 131d may be formed to provide a taut tension force to the main body part 110 when the main body part 110 may be welded to the frame 300, and may be removed during an assembling process. A bonding part 115 (refer to FIG. 4) may be a boundary region between the main body part 110, and one of the side clamping parts 120 and 121, and the slant clamping parts 131a, 131b, 131c, and 131d. The bonding part 115 may be welded to the frame 300.

When the plurality of mask sticks 100 are combined with the frame 300, the mask frame assembly 400 may be formed as illustrated in FIG. 4. The bonding part 115 of each mask stick 100 may be welded to the frame while a remaining portion of each mask stick 100 may be positioned to allow the pattern 111 to be disposed within an opening 301 of the frame. For example, each mask stick 100 may be attached to the frame 300 at the bonding parts 115 of the mask stick 100, and unattached to the frame 300 at, for example, a central portion of the mask stick 100. As shown in dotted lines, the side clamping parts 120 and 121, and the slant clamping parts 131a, 131b, 131c, and 131d, may be welded and then removed. For example, the side clamping parts 120 and 121, and the slant clamping parts 131a, 131b, 131c, and 131d may be removed after the mask sticks are welded to the frame 300 at the bonding part 115.

The side clamping parts 120 and 121, and the slant clamping parts 131a, 131b, 131c, and 131d may be formed to externally extend from the main body part 110. In more detail, the side clamping parts 120 and 121 may extend from opposing sides of the main body part 110. That is, the side clamping parts 120 and 121 may be formed to externally extend from opposing sides of the main body part 110 in a lengthwise direction (an X-axis direction) of the main body part 110. For example, the side clamping parts 120 and 121 may extend horizontally from opposing ends of the main body part 110. The side clamping part 121 may include first side clamping parts 121a and 121b. The side clamping part 120 may include second side clamping parts 122a, and 122b. The first side clamping parts 121a and 121b may extend externally from a first side or end of the main body part 110 in the X-axis or horizontal direction; the second side clamping parts 122a and 122b may extend externally from a second opposing side or end of the main body part 110 in the X-axis or horizontal direction.

Figure 3:
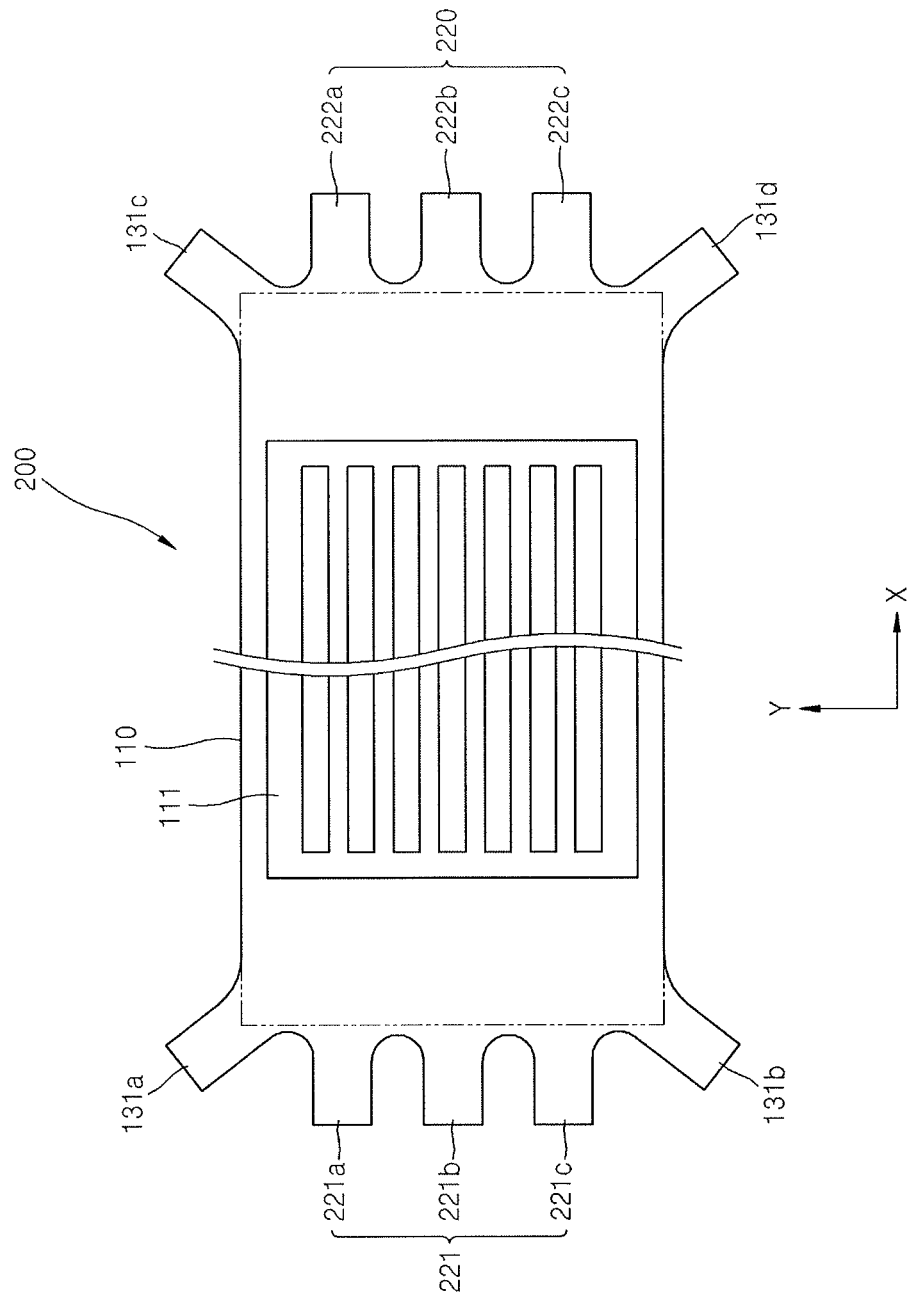
FIG. 3 illustrates a plane view of a mask stick according to another embodiment

The number of the first and second side clamping parts 121a, 121b, 122a, and 122b may be the same or different. As illustrated in FIGS. 1 and 2, for example, when two first side clamping parts 121a and 121b are formed, two second side clamping parts 122a and 122b may be formed. As illustrated in FIG. 3, when three first side clamping parts 221a, 221b, and 221c are formed, three second side clamping parts 222a, 222b, and 222c may be formed.

A distance t1 between the first side clamping parts 121a and 121b may be equal to a distance t2 between the second side clamping parts 122a and 122b. Lengths of the first side clamping parts 121a and 121b may be equal to each other, and lengths of the second side clamping parts 122a and 122b may be equal to each other. Also, the lengths of the first side clamping parts 121a and 121b may be equal to the lengths of the second side clamping parts 122a and 122b. Widths w1 and w2 of the first side clamping parts 121a and 121b may be equal to each other, and widths w3 and w4 of the second side clamping parts 122a and 122b may be equal to each other. Also, the widths w1 and w2 of the first side clamping parts 121a and 121b may be equal to the widths w3 and w4 of the second side clamping parts 122a and 122b.

The slant clamping parts 131a, 131b, 131c, and 131d may be disposed at outermost sides of the side clamping parts 120 and 121, e.g., corners of the mask stick 100. That is, the slant clamping parts 131a and 131b may be disposed at outermost sides of the first side clamping parts 121a and 121b, respectively, and the slant clamping parts 131c and 131d may be disposed at outermost sides of the second side clamping parts 122a and 122b, respectively.

The slant clamping parts 131a, 131b, 131c, and 131d may extend from four corner regions 110a, 110b, 110c, and 110d of the main body part 110, respectively.

Also, the slant clamping parts 131a, 131b, 131c, and 131d may form a predetermined angle θ with respect to the side clamping part 120. The angle θ between the slant clamping parts 131*a*, 131*b*, 131*c*, and 131*d*, and the side clamping parts 120 and 121 may be greater than 0° and less than 90° (0°<θ<90°). That is, the first side clamping part 121*a* and the slant clamping part 131*a* may form an angle θ1, the first side clamping part 121*b* and the slant clamping part 131*b* may have an angle θ2, the second side clamping part 122*a* and the slant clamping part 131*c* may have an angle θ3, and the second side clamping part 122*b* and the slant clamping part 131*d* may have an angle θ4. The angles θ1, θ2, θ3, and θ4 may be the same.

That is, the slant clamping part 131*a* may extend from the corner region 110*a* so as to form the angle θ1 with the first side clamping part 121*a*. The slant clamping part 131*b* may extend from the corner region 110*b* so as to form the angle θ2 with the first side clamping part 121*b*. The slant clamping part 131*c* may extend from the corner region 110*c* so as to form the angle θ3 with the second side clamping part 122*a*. The slant clamping part 131*d* may extend from the corner region 110*d* so as to form the angle θ4 with the second side clamping part 122*b*.

The slant clamping parts 131*a*, 131*b*, 131*c*, and 131*d* may have the same length and the same width.

In this manner, the first side clamping parts 121*a* and 121*b*, and the slant clamping parts 131*a* and 131*b*, and the second side clamping parts 122*a* and 122*b* and the slant clamping parts 131*c* and 131*d* may be symmetrical to each other with respect to the main body part 110. By forming the clamping parts to be symmetrical to each other with respect to the main body part 110, a tension force may be uniformly applied to the main body part 110.

The mask stick 100 may be welded to the frame 300. In an implementation, the bonding part 115 may be welded to the frame 300, while the side clamping part 120 and the slant clamping parts 131*a*, 131*b*, 131*c*, and 131*d* of the mask stick 100 are held and pulled by a tensioner (not shown). For example, opposing ends of the mask stick 100, including the side clamping part 120 and the slant clamping parts 121*a*, 121*b*, 122*a*, and 122*b*, may be pulled in opposite directions by the tensioner, and held in a pulled or stretched state when the mask stick 100 is welded to the frame. In an embodiment, as described previously, the slant clamping parts 131*a*, 131*b*, 131*c*, and 131*d*, and the side clamping parts 121*a*, 121*b*, 122*a*, and 122*b* may be formed to have the predetermined angles θ1, θ2, θ3, and θ4. As such, the tension force may be applied to the main body part 110 not only in the lengthwise direction (the X-axis direction) of the main body part 110 but also in a widthwise direction (an Y-axis direction) of the main body part 110. Thus, it is possible to prevent or reduce occurrence of a wave at a central portion of the main body part 110. Since the main body part 110 maintains its flat state, adherence between a deposition-target object (not shown) and the mask stick 100 may be increased so that a possibility of occurrence of a shadow defect during the deposition process may decrease.

FIG. 3 is a plane view of a mask stick 200 according to another embodiment. In the embodiment illustrated in FIGS. 1 and 2, two first side clamping parts 121*a* and 121*b*, and two second side clamping parts 122*a* and 122*b* may be formed, whereas, in the embodiment illustrated in FIG. 3, a side clamping part 221 includes three first side clamping parts 221*a*, 221*b*, and 221*c*, and a side clamping part 220 includes three second side clamping parts 222*a*, 222*b*, and 222*c*. However, one or more embodiments are not limited to the embodiments shown. Thus, in another embodiment, four or more first side clamping parts, and four or more second side clamping parts may be formed.

In the mask stick 200 of FIG. 3, the three first side clamping parts 221*a*, 221*b*, and 221*c* may be separated from each other by the same distance therebetween. The three second side clamping parts 222*a*, 222*b*, and 222*c* may be separated from each other by the same distance therebetween. Also, the distance between the first side clamping parts 221*a*, 221*b*, and 221*c* may be equal to the distance between the second side clamping parts 222*a*, 222*b*, and 222*c*. . In addition, widths of the first and second side clamping parts 221*a*, 221*b*, 221*c*, 222*a*, 222*b*, and 222*c* may be equal to each other, and lengths of the first and second side clamping parts 221*a*, 221*b*, 221*c*, 222*a*, 222*b*, and 222*c* may be equal to each other.

A slant clamping part 131*a* may form a predetermined angle with the first side clamping part 221*a*. A slant clamping part 131*b* may form a predetermined angle with the first side clamping part 221*c*. A slant clamping part 131*c* may form a predetermined angle with the second side clamping part 221*a*. A slant clamping part 131*d* may form a predetermined angle with the second side clamping part 221*c*. The angles between each of the slant clamping parts 131*a*, 131*b*, and the side clamping part 221 and the angles between each of the slant clamping parts 131*c* and 131*d* and the side clamping part 220 may be the same, and may be greater than 0° and less than 90°.

Widths of the slant clamping parts 131*a*, 131*b*, 131*c*, and 131*d* may be equal to each other; and lengths of the slant clamping parts 131*a*, 131*b*, 131*c*, and 131*d* may be equal to each other.

A process of assembling the mask frame assembly 400 by using the mask stick 100 may be performed in the order shown in FIGS. 5A through 5D.

First, the mask stick 100 and the frame 300 may be arranged such that, e.g. opposing ends of the mask stick 100 are aligned with opposing sides of the frame 300. The frame 300 may form an outer frame of an assembly and may be formed to have a quadrangular shape including an opening 301 formed in a central portion of the frame 300. The bonding parts 115 of the mask stick 100 may be welded and then fixed to a pair of sides of the frame 300, wherein the pair of sides face each other.

The mask stick 100 may be a member having a longish stick shape, and having the pattern 111 disposed in the opening 301. As described above, the bonding parts 115 between the main body part 110 and the clamping units 120, 121, 131*a*, 131*b*, 131*c*, and 131*d* may be welded to the frame 300.

Figure 5A:
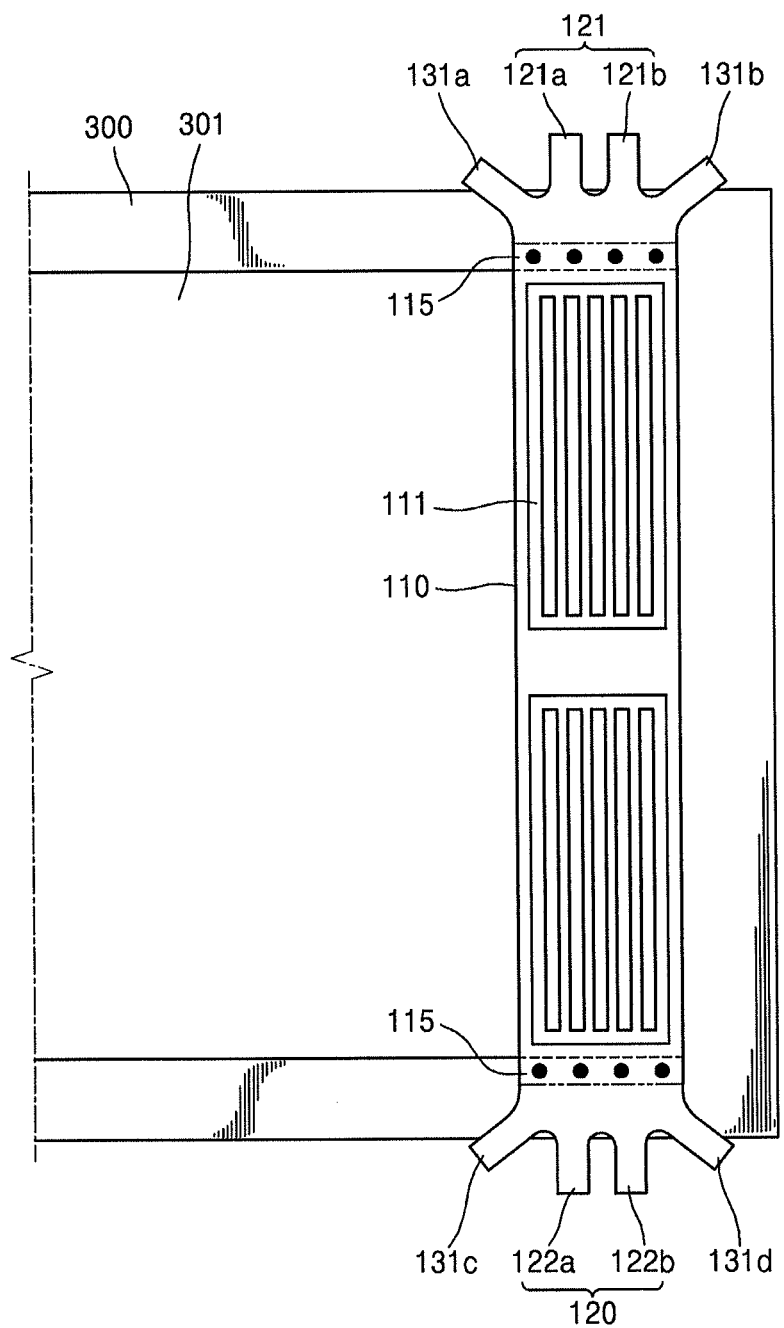
FIGS. 5A through 5D sequentially illustrate a process of assembling the mask frame assembly of FIG. 4.

FIG. 5A illustrates a process of combining the first mask stick 100 with the frame 300. First, the side clamping part 121 and the slant clamping parts 131*a*, 131*b*, 131*c*, and 131*d* at both ends of the first mask stick 100 may be held and tautly pulled by a tensioner (not shown) in an outer direction. Then, a taut tension force T may be applied to the mask stick 100, and as described above, the slant clamping parts 131*a*, 131*b*, 131*c*, and 131*d* may form predetermined angles with the side clamping parts 121*a*, 121*b*, 122*a*, and 122*b*, respectively, so that the tension force T may be applied to the mask stick 100 not only in the lengthwise direction (the X-axis direction) of the main body part 110, but also in the widthwise direction (the Y-axis direction) of the main body part 110. Thus, waves (curves) may be significantly decreased in the main body part 110 of the mask stick 100, so that the mask stick 100 has increased flatness. In this state, the mask stick 100 may be fixed by welding the bonding parts 115 to the frame 300.

Figure 5B:
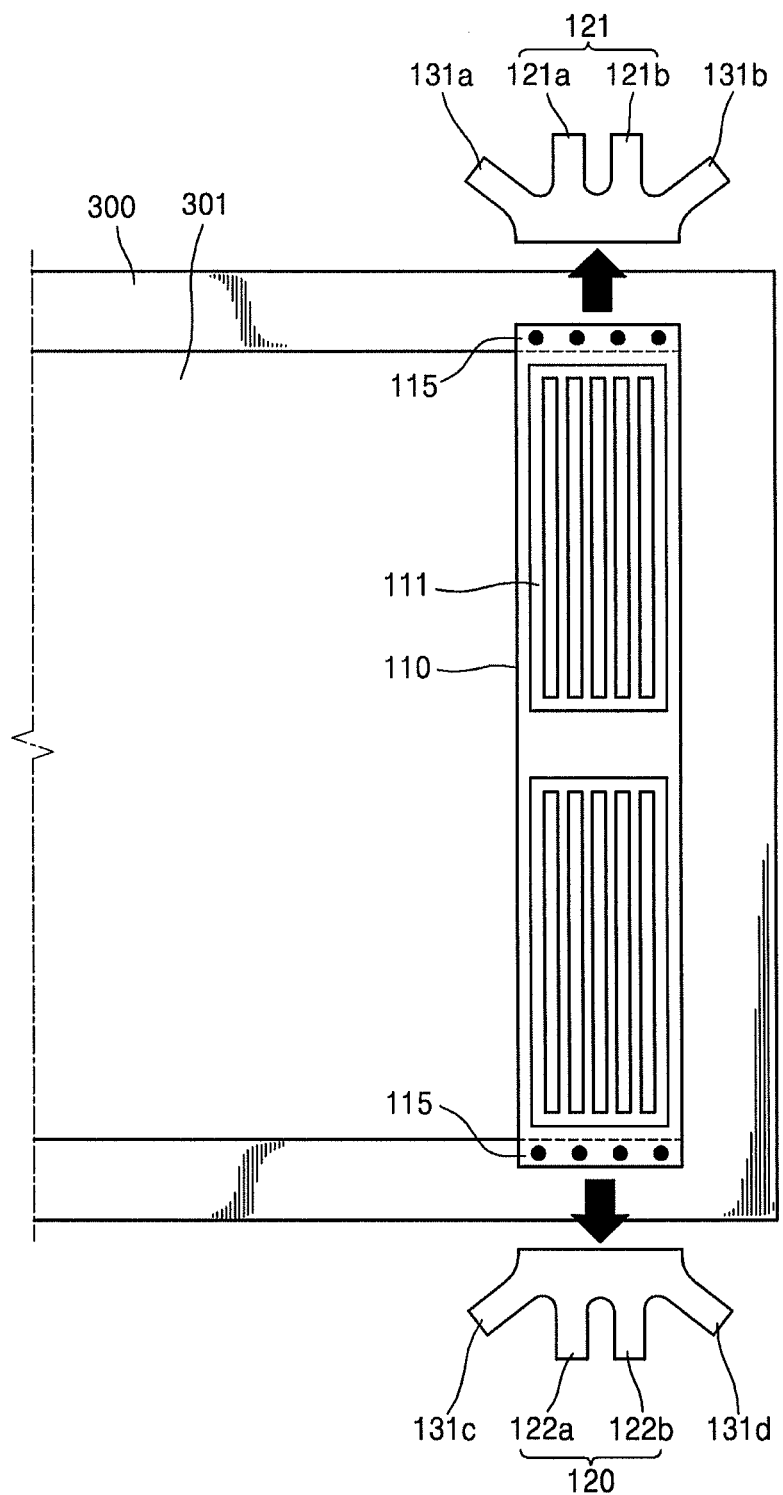

Afterward, after the welding operation is completed, as illustrated in FIG. 5B, the side clamping parts 120 and 121 and the slant clamping parts 131*a*, 131*b*, 131*c*, and 131*d* at outer sides of the bonding parts 115 may be cut and removed. Since the slant clamping parts 131*a*, 131*b*, 131*c*, and 131*d* may form the predetermined angles with the side clamping parts 121a, 121b, 122a, and 122b, respectively, if the slant clamping parts 131a, 131b, 131c, and 131d are kept, they may cause an interference with slant clamping parts 131a, 131b, 131c, and 131d of next mask stick 100. Thus, before another mask stick 100 is welded to the frame 300, the side clamping parts 120 and 121, and the slant clamping parts 131a, 131b, 131c, and 131d may be cut and removed.

Figure 5C:
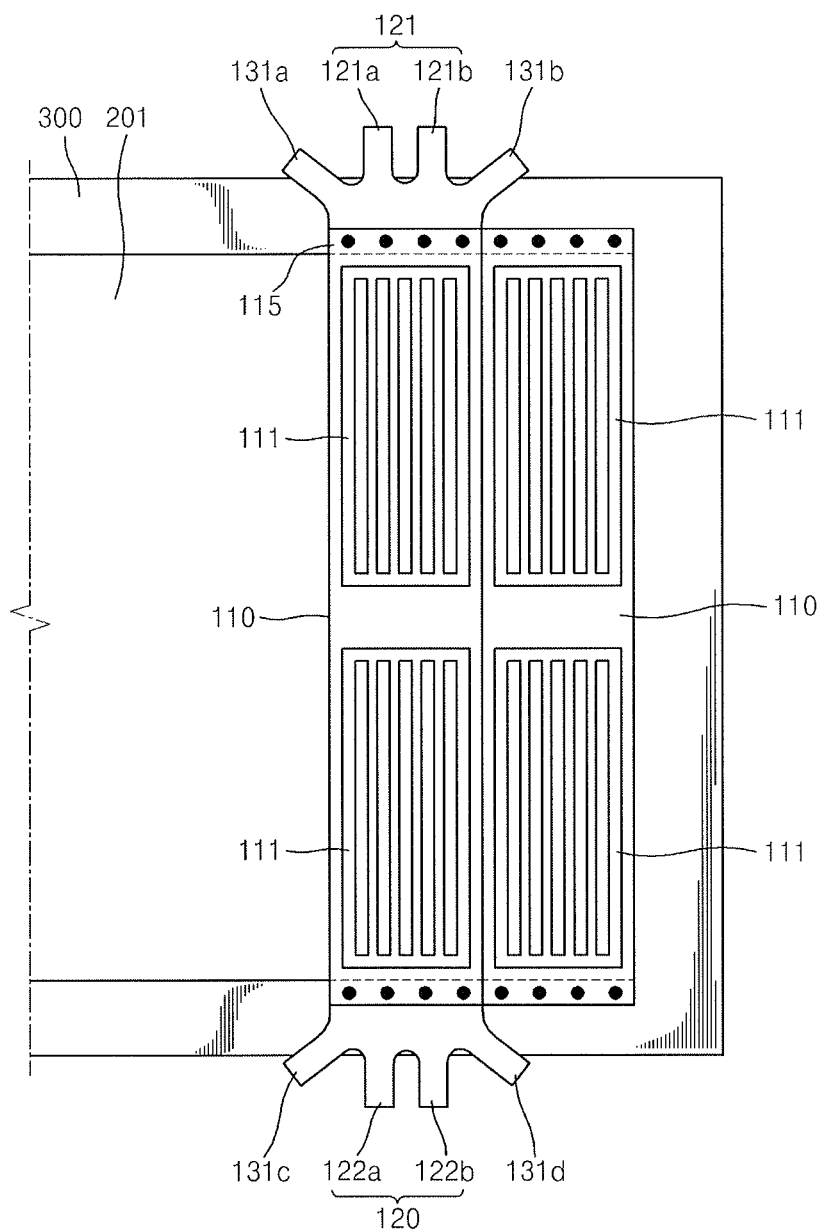

In this manner, after welding of the first mask stick 100 is completed, as illustrated in FIG. 5C, a second mask stick 100 may be welded in the same manner. That is, a side clamping part 120 and slant clamping parts 131a, 131b, 131c, and 131d of the second mask stick 100 may be held by a tensioner, so that a tension force T is applied to the second mask stick 100. Then, bonding parts 115 may be welded to a frame 300. To the slant clamping parts 131a, 131b, 131c, and 131d, may apply a tension force T to the second mask stick 100 in both of a lengthwise direction and a widthwise direction of a main body part 110. When the welding operation is performed, waves in the mask stick 100 may, thereby, be significantly decreased.

Figure 5D:
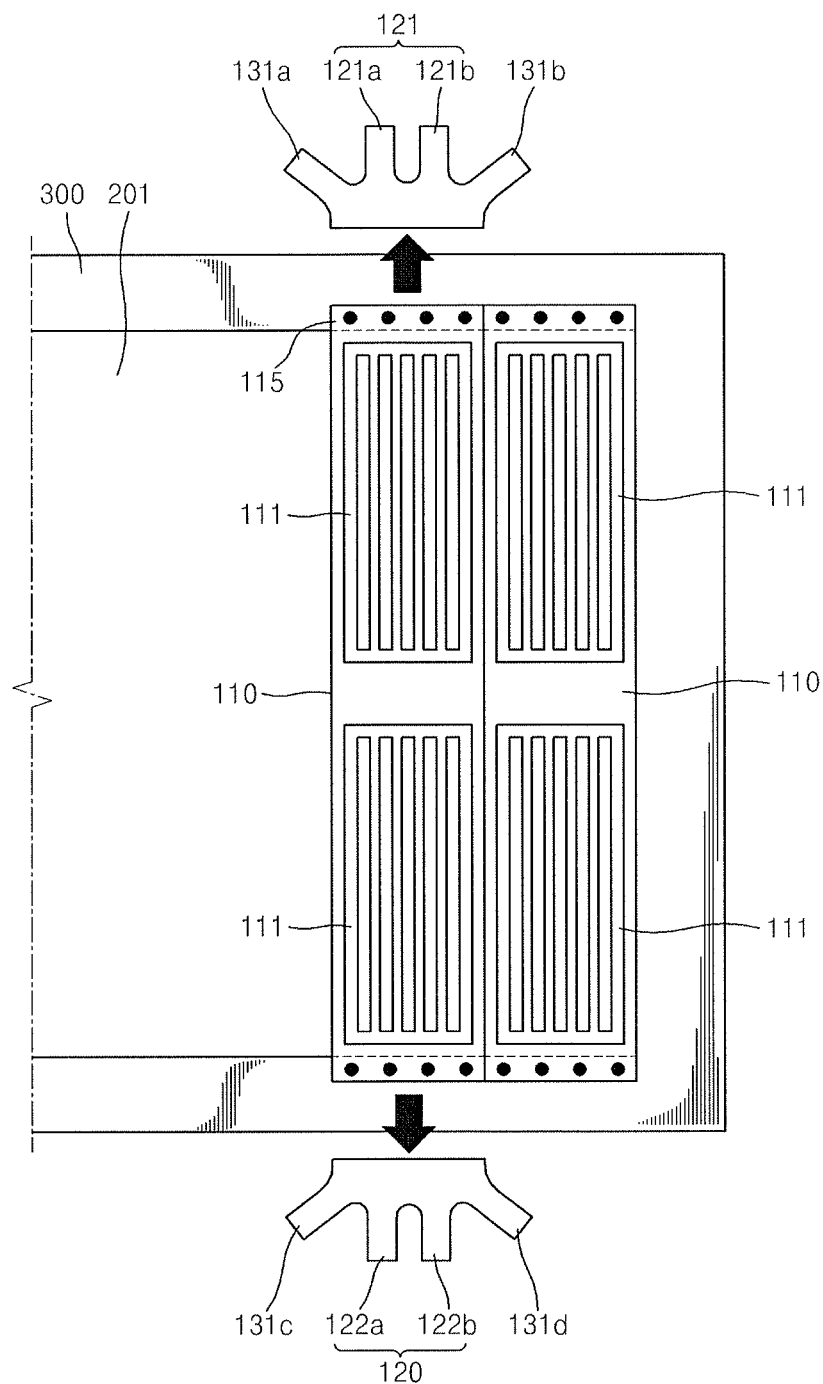

Similarly, after the welding operation is complete, as illustrated in FIG. 5D, the side clamping part 120 and the slant clamping parts 131a, 131b, 131c, and 131d at outer sides of the bonding parts 115 may be cut and removed.

In this manner, when each mask stick 100 is welded to the frame 300, the mask frame assembly 400 of FIG. 4 may be completely assembled.

When the mask frame assembly 400 is assembled with the mask stick 100, as described above, it is possible to combine the mask stick 100 with the frame 300 and apply a very strong tension force to the mask stick 100. The occurrence of waves in the mask stick may, thereby, be prevented. As such, the mask frame assembly 400 may be further accurately formed.

The mask frame assembly 400 may be formed in various thin film deposition processes, including an organic EML patterning process.

By way of summary and review, a mask stick according to the related art is enlarged to have a length of about 1,840 mm so as to meet a request for a large display device. However, the mask stick has a problem since a wave occurs in a lengthwise direction thereof. That is, as the length of the mask stick is increased, the mask stick may not maintain its taut status in a lengthwise direction, and thus, curves maybe be formed in the mask stick, which is referred to as a wave problem. Due to the wave problem, a problem occurs in a deposition process in which a precise pattern is deposited by using the mask stick.

In contrast, according to one or more embodiments, the mask stick may be tautly combined with the frame to facilitate, for example, a reduction of waves. Thus, by using the mask stick in a deposition process, it may be possible to perform a more stable and accurate patterning operation.

One or more aspects of embodiments may provide a mask stick having an improved structure that limits the occurrence of a wave, and a method of assembling a mask frame assembly by using the mask stick.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mask stick for use in a deposition process, the mask stick comprising:
   a main body part having a pattern formed therein, a deposition material being deposited on a deposition-target object via the pattern, the main body part including a lateral edge;
   a bonding part having an outer side and extending from the lateral edge of the main body part to the outer side in a first direction; and
   a detachable clamping portion extending from the outer side of the bonding part, the detachable clamping portion including:
      one or more side clamping parts extending from a side of the detachable clamping portion, a longitudinal side of each side clamping part extending along the first direction; and
      a slant clamping part disposed adjacent to and separated from an outermost one of the one or more side clamping parts, a longitudinal side of each slant clamping part extending along a second direction,
      wherein an angle ($\theta$) between the first and second directions is greater than 0° and less than 90° (0°<$\theta$<90°).

2. The mask stick of claim 1, wherein:
   the main body part has a polygonal shape, and
   the one or more side clamping parts are linear and extend away from the polygonal shape of the main body part along the first direction and in parallel to a longitudinal side of the main body.

3. The mask stick of claim 2, wherein the one or more side clamping parts include:
   one or more first side clamping parts extending away from the lateral edge of the main body part; and
   one or more second side clamping parts extending away from a second lateral edge of the main body part, the additional lateral edge opposing the lateral edge.

4. The mask stick of claim 3, wherein a number of the one or more first side clamping parts is equal to a number of the one or more second side clamping parts.

5. The mask stick of claim 3, wherein the one or more first side clamping parts include two or more first side clamping parts spaced equally from each other, and the one or more second side clamping parts include two or more second side clamping parts spaced equally from each other.

6. The mask stick of claim 5, wherein spaces between the two or more first side clamping parts are equal to spaces between the two or more second side clamping parts.

7. The mask stick of claim 3, wherein the one or more first side clamping parts and the one or more second side clamping parts are at corresponding positions at the opposing ends of the mask stick.

8. The mask stick of claim 1, wherein the one or more side clamping parts include two or more side clamping parts and lengths of the two or more side clamping parts are the same.

9. The mask stick of claim 8, wherein widths of the two or more side clamping parts are the same.

10. The mask stick of claim 1, wherein the slant clamping part is linear and extends along the second direction from a corner region of the detachable clamping region.

11. The mask stick of claim 10, wherein the slant clamping part includes a plurality of slant clamping parts that extend from two corner regions of the detachable clamping region.

12. The mask stick of claim 11, wherein angles between each of the plurality of slant clamping parts and each of the one or more side clamping parts that are adjacent to the plurality of slant clamping parts are the same.

13. The mask stick of claim 11, wherein lengths of the plurality of slant clamping parts are equal to each other.

14. The mask stick of claim 13, wherein widths of the plurality of slant clamping parts are equal to each other.

15. The mask stick of claim 1, wherein the bonding part is welded to a frame of a mask frame assembly.

16. The mask stick of claim 2, wherein:
the one or more side clamping parts include at least four side clamping parts parallel to each other, two of the four side clamping parts extending away from the lateral edge of the main body part and the remaining two of the four side clamping parts extending away from a second lateral edge of the main body part, the additional lateral edge being opposite the lateral edge,
the slant clamping part includes four slant clamping parts, each slant clamping part of the four slant clamping parts extends away from a different corner of the main body part, and
the at least two side clamping parts on each end of the main body part is between two slant clamping parts, each side clamping part being spaced apart from an adjacent side clamping part and slant clamping part.

17. The mask stick of claim 1, wherein a shape and a size of each of the one or more side clamping parts in identical to those of the slant clamping part.

18. The mask stick of claim 1, wherein each of the side clamping parts and slant clamping part is rectangular, a longer side of each rectangular side clamping part or slant clamping part defining a corresponding longitudinal side.

19. The mask stick of claim 1, wherein each of the side clamping parts has a first width, the slant clamping part has a second width, and the first width is equal to the second width.

20. A method of assembling a mask frame assembly for use in a deposition process, the method comprising:
positioning one or more mask sticks on a frame, each of the one or more mask sticks including a main body part having a pattern formed therein, the main body part including a lateral edge, a bonding part having an outer side and extending from the lateral edge to the outer side in a first direction, and a detachable clamping portion extending from the outer side of the bonding part, the detachable clamping portion including one or more side clamping parts extending from a side of the detachable clamping portion to have a longitudinal side along the first direction, and a slant clamping part adjacent to and separated from an outermost one of the one or more side clamping parts and having a longitudinal side of along a second direction, an angle (θ) between the first and second directions being greater than 0° and less than 90°, a deposition material being deposited on a deposition target object via the pattern;
welding the bonding part to the frame by holding in position the one or more side clamping parts and the slant clamping part of each of the one or more mask sticks and applying a tension force to the main body part; and
detaching the detachable clamping portion from the one or more mask sticks after welding is completed.

21. The method of claim 20, wherein the one or more side clamping parts extend horizontally away from ends of the main body part.

22. The method of claim 21, wherein the one or more side clamping parts include:
one or more first side clamping parts extending away from the lateral edge of the main body part; and
one or more second side clamping parts extending away from a second lateral edge of the main body part, the second end opposing the lateral edge.

23. The method of claim 22, wherein a number of the one or more first side clamping parts is equal to a number of the one or more second side clamping parts.

24. The method of claim 22, wherein the one or more first side clamping parts include two or more first side clamping parts spaced equally from each other.

25. The method of claim 24, wherein the one or more second side clamping parts include two or more second clamping parts spaced equally from each other.

26. The method of claim 25, wherein spaces between the one or more first side clamping parts are equal to spaces between the one or more second side clamping parts.

27. The method of claim 22, wherein the one or more first side clamping parts and the one or more second side clamping parts are at corresponding positions at the opposing first and second ends of the mask stick.

28. The method of claim 22, wherein the number of the one or more first side clamping parts is equal to the number of the one or more second side clamping parts.

29. The method of claim 20, wherein the one or more side clamping parts include two or more side clamping parts and lengths of the two or more side clamping parts are the same.

30. The method of claim 20, wherein the one or more side clamping parts include two or more side clamping parts and widths of the two or more side clamping parts are the same.

31. The method of claim 20, wherein the slant clamping part extends away from a corner of the main body part.

32. The method of claim 31, wherein the slant clamping part includes a plurality of slant clamping parts that extend away from four corners of the main body part.

33. The method of claim 32, wherein angles between each of the plurality of slant clamping parts and each of the one or more side clamping parts that are adjacent to the plurality of slant clamping parts are the same.

34. The method of claim 32, wherein lengths of the plurality of slant clamping parts are equal to each other.

35. The method of claim 32, wherein widths of the plurality of slant clamping parts are equal to each other.

* * * * *